USO10834832B2

(12) United States Patent
Mori

(10) Patent No.: US 10,834,832 B2
(45) Date of Patent: Nov. 10, 2020

(54) IMAGE DISPLAY DEVICE

(71) Applicant: Mitsubishi Electric Corporation, Tokyo (JP)

(72) Inventor: Yoshinosuke Mori, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/480,757

(22) PCT Filed: Apr. 7, 2017

(86) PCT No.: PCT/JP2017/014589
§ 371 (c)(1),
(2) Date: Jul. 25, 2019

(87) PCT Pub. No.: WO2018/185945
PCT Pub. Date: Oct. 11, 2018

(65) Prior Publication Data
US 2020/0022270 A1   Jan. 16, 2020

(51) Int. Cl.
*H05K 5/00*      (2006.01)
*G09F 9/302*    (2006.01)
(Continued)

(52) U.S. Cl.
CPC ......... *H05K 5/0017* (2013.01); *G09F 9/3026* (2013.01); *H01F 7/0263* (2013.01);
(Continued)

(58) Field of Classification Search
CPC .. G09F 9/3026; H05K 5/0017; H05K 5/0021; H05K 5/0208; H05K 5/023; H05K 7/20963; H01F 7/0263
See application file for complete search history.

(56) References Cited

U.S. PATENT DOCUMENTS

| 9,721,711 | B2* | 8/2017 | Liu ..................... H01F 7/0252 |
| 2009/0021127 | A1* | 1/2009 | Miller .................. G09F 9/3026 312/223.5 |
| 2014/0003052 | A1 | 1/2014 | Hemiller et al. |

FOREIGN PATENT DOCUMENTS

| JP | S4868002 U | 8/1973 |
| JP | S6437183 A | 2/1989 |

(Continued)

OTHER PUBLICATIONS

International Search Report (PCT/ISA/210) with translation, and Written Opinion (PCT/ISA/237) dated Jun. 20, 2017, by the Japan Patent Office as the International Searching Authority for International Application No. PCT/JP2017/014589.
(Continued)

*Primary Examiner* — Jayprakash N Gandhi
*Assistant Examiner* — Hung Q Dang
(74) *Attorney, Agent, or Firm* — Buchanan Ingersoll & Rooney PC

(57) ABSTRACT

An image display device includes a frame including posts partitioning the inside space defined by rectangular frame members in a grid, and a display unit including two or more light-emitting diodes (LEDs) disposed on one surface of a substrate and a case accommodating the substrate and the LEDs. The case includes a bottom plate and an opening facing the bottom plate. The bottom plate faces the substrate, the opening exposes the LEDs, and a rear surface of the bottom plate is waterproofed. The display unit is accommodated in each of two or more compartments partitioned in a grid by the posts of the frame. A rear plate covers, from the rear surface of the bottom plate, the frame in which the display unit is accommodated, and a magnet is attached to a surface of the rear plate to attach/detach the rear plate to/from the frame.

8 Claims, 16 Drawing Sheets

(51) Int. Cl.
*H01F 7/02* (2006.01)
*H05K 5/02* (2006.01)
H05K 7/20 (2006.01)

(52) U.S. Cl.
CPC ........... *H05K 5/0021* (2013.01); *H05K 5/023* (2013.01); *H05K 5/0208* (2013.01); H05K 7/20963 (2013.01)

(56) References Cited

FOREIGN PATENT DOCUMENTS

| | | |
|---|---|---|
| JP | H0450988 U | 4/1992 |
| JP | H0710988 U | 2/1995 |
| JP | H0856320 A | 2/1996 |
| JP | H0960390 A | 3/1997 |
| JP | 2002108502 A | 4/2002 |
| JP | 2005173033 A | 6/2005 |

OTHER PUBLICATIONS

Office Action (Notice of Reasons for Refusal) dated May 12, 2020, by the Japanese Patent Office in corresponding Japanese Patent Application No. 2019-511049 and English translation of the Office Action. (7 pages).

\* cited by examiner

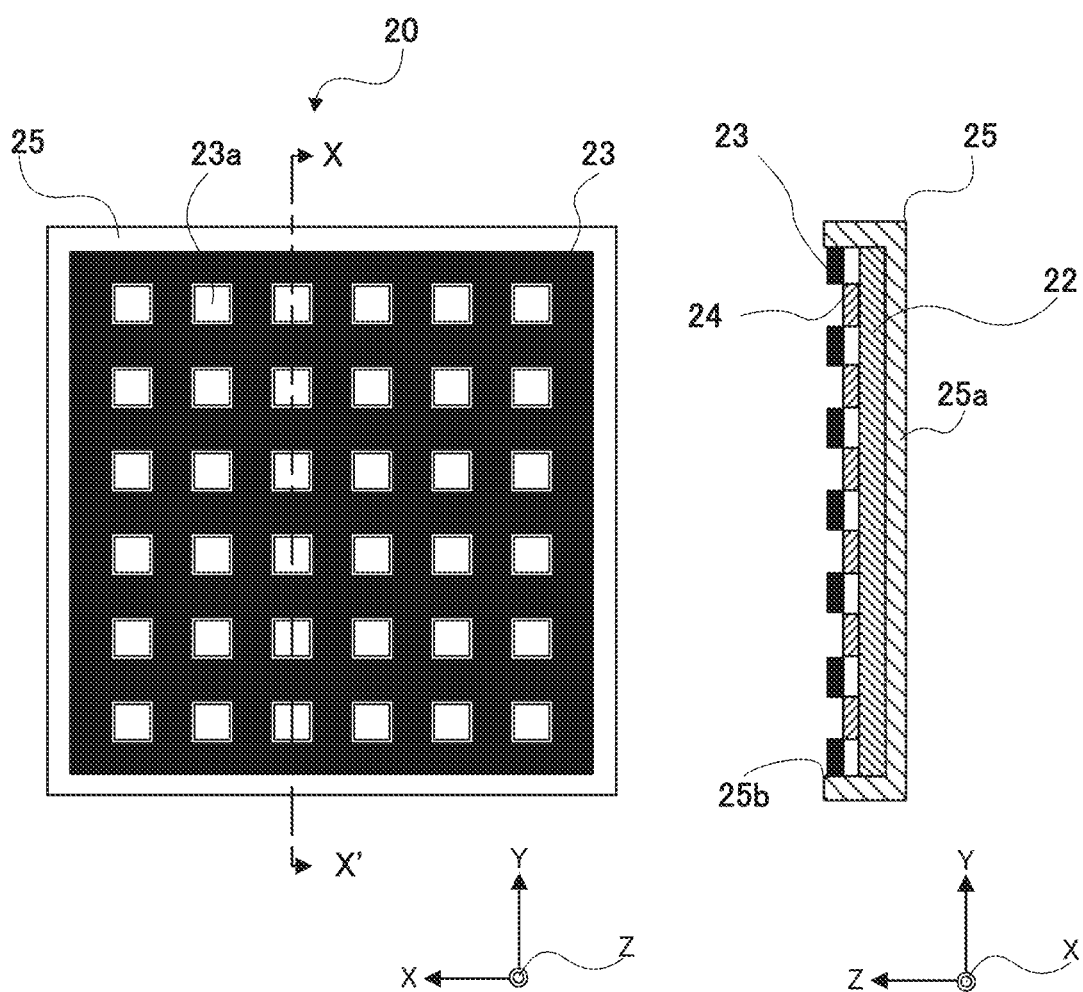

FIG.3A
FIG.3B
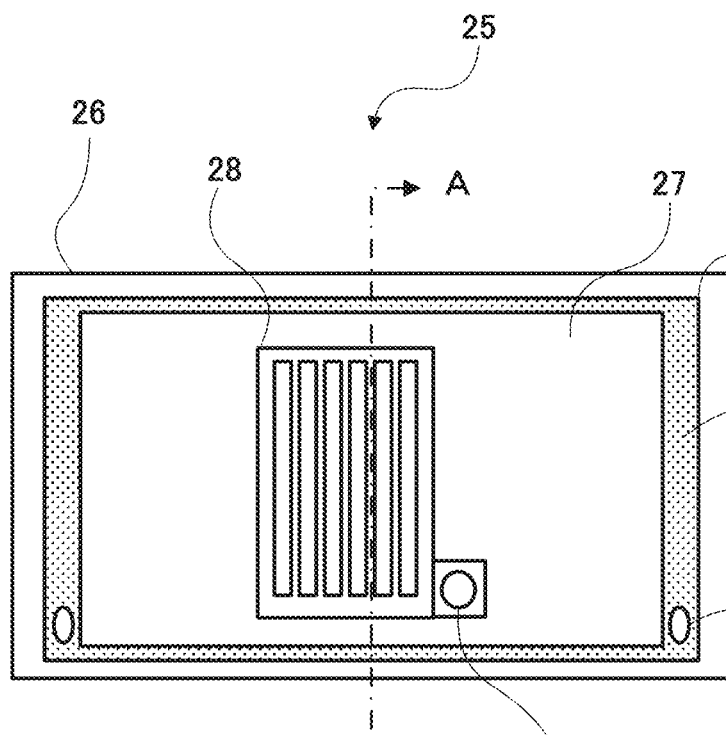
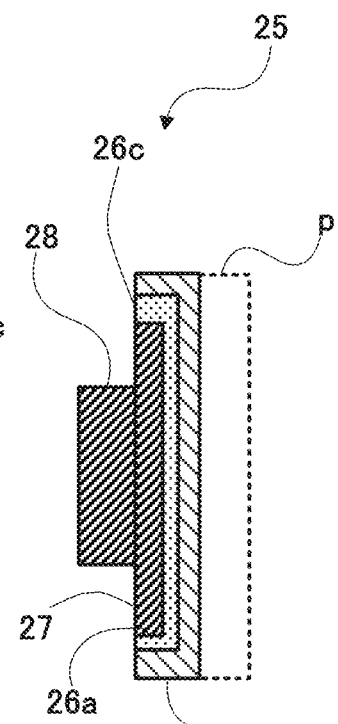
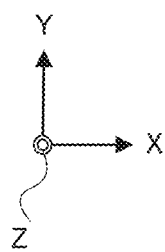
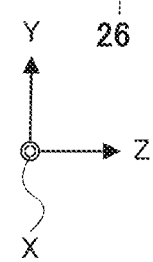

IMAGE DISPLAY DEVICE

TECHNICAL FIELD

The present disclosure relates to an image display device for displaying an image.

BACKGROUND ART

Large image display devices are used in, for example, shops, public spaces, and transportation facilities. As described in Patent Literature 1, known image display devices include a plurality of light-emitting diode (LED) modules mounted into a frame. The frame has the inside space that is partitioned into a plurality of compartments by posts. An LED module is fitted in each compartment. The rear surface of the image display device is covered with rear plates to protect internal electronic circuits.

CITATION LIST

Patent Literature

Patent Literature 1: U.S. Patent Application Publication No. 2014/0003052

SUMMARY OF INVENTION

Technical Problem

The image display device described in Patent Literature 1 has the rear plates that is fastened to the frame with screws. Accordingly, to attach or detach any rear plate for maintenance of the image display device, the screws are to be removed and attached each time. This is time-consuming and laborious. Also, screws can be lost and thus the management of the screws is troublesome. In addition, large image display devices involve maintenance operations at high places. Accordingly, in this case, time-consuming and laborious tasks should be avoided as much as possible.

In consideration of the aforementioned circumstances, an objective of the present disclosure is to provide an image display device that allows easy attachment and detachment of rear plates and easy management of parts.

Solution to Problem

In order to attain the aforementioned objective, an image display device according to the present disclosure includes a frame, a display unit arranged in the frame and to display an image, a rear plate covering a rear surface of the display unit, and an attaching/detaching member attaching the rear plate to the frame in a detachable manner.

Advantageous Effects of Invention

The image display device according to the present disclosure includes the attaching/detaching member, and thus allows easy attachment and detachment of the rear plates and easy management of the parts.

BRIEF DESCRIPTION OF DRAWINGS

FIG. 2A is a front view of a display unit included in the image display device according to the embodiment; FIG. 2B is a cross-sectional view of the display unit taken along line X-X';

FIG. 3A is a rear view of a case for the display unit according to the embodiment; FIG. 3B is a cross-sectional view taken along line A-A';

DESCRIPTION OF EMBODIMENTS

Embodiment of an image display device according to the present disclosure is described in detail with reference to the drawings. The embodiment is illustrative and should not be construed to restrict the scope of the present disclosure. Further, a person of ordinary skill in the art can achieve other embodiments in which some or all of elements of the described embodiment are replaced with their equivalents, and the other embodiments also fall within the scope of the present disclosure.

EMBODIMENT

An image display device 1 according to the present embodiment is described in detail with reference to FIGS. 1 to 11. In FIGS. 1 to 11, the XYZ-coordinate system is defined. Under the assumption that the image display device 1 is disposed perpendicularly to the ground, the horizontal direction is defined as X-axis direction, the vertical direction is defined as Y-axis direction, and a direction perpendicular to X-axis and Y-axis is defined as Z-direction. Mere indication of X, Y, and Z mean positive directions. The directions opposite to these directions are defined as negative directions.

Figure 1:
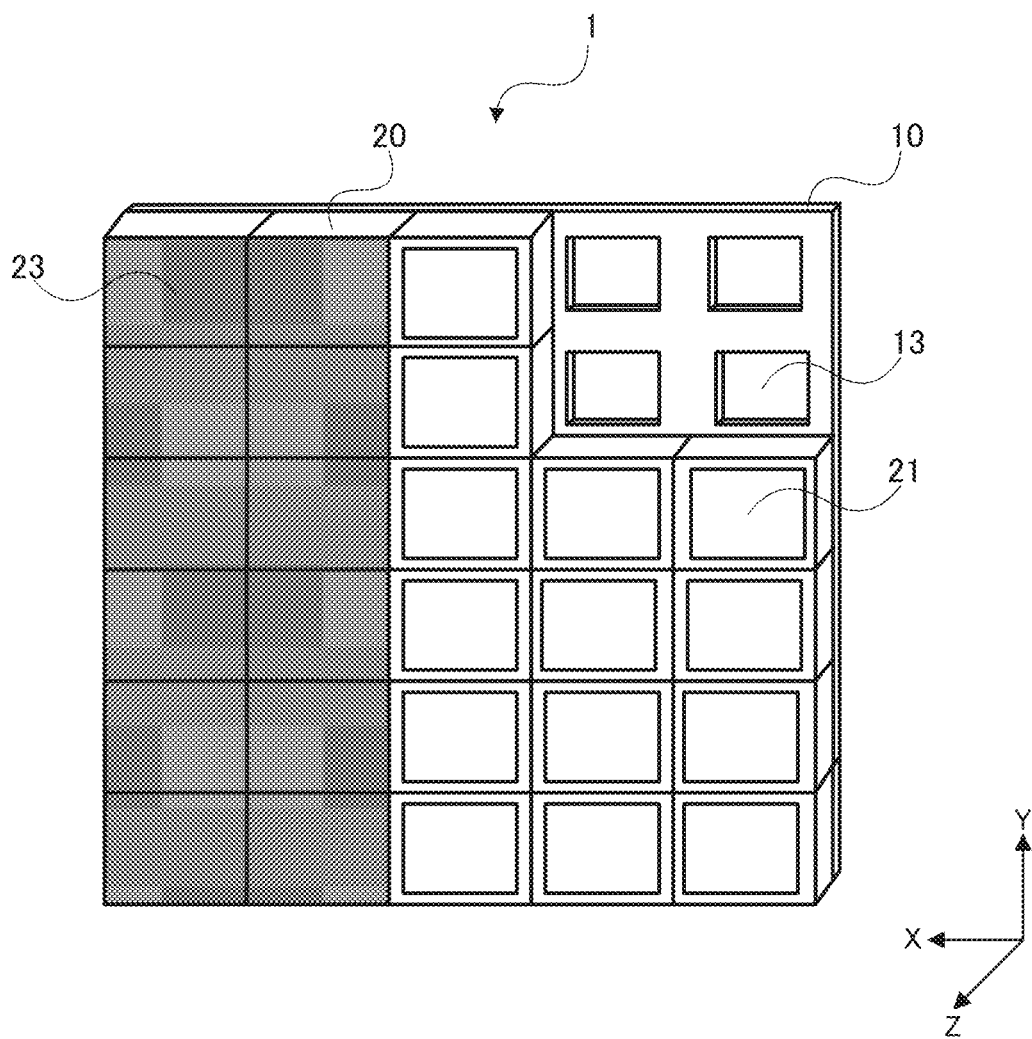
FIG. 1 is a perspective view of an image display device according to an embodiment of the present disclosure.
Figure 4:
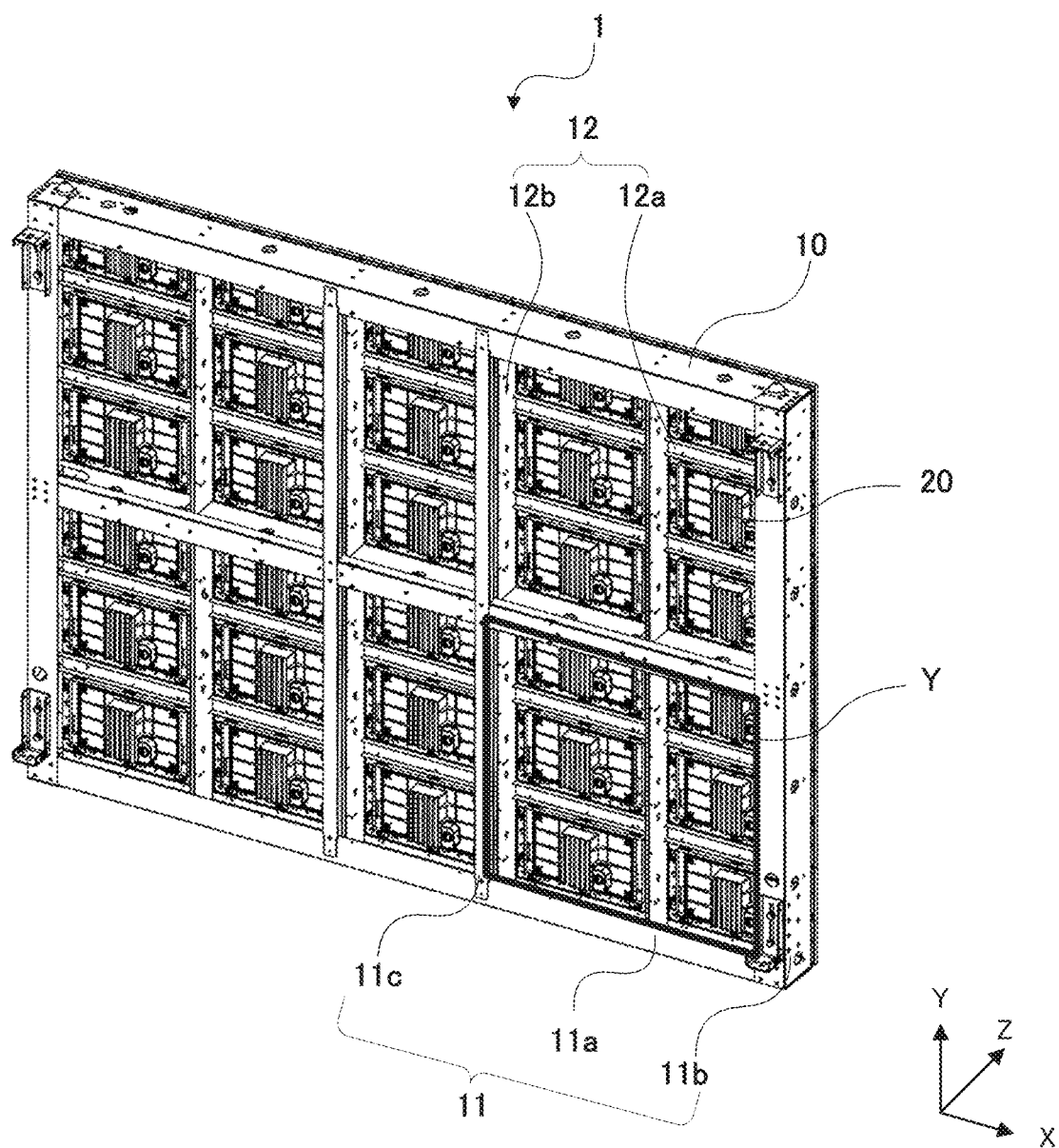
FIG. 4 is a rear view of the image display device according to the embodiment without rear plates.
Figure 5:
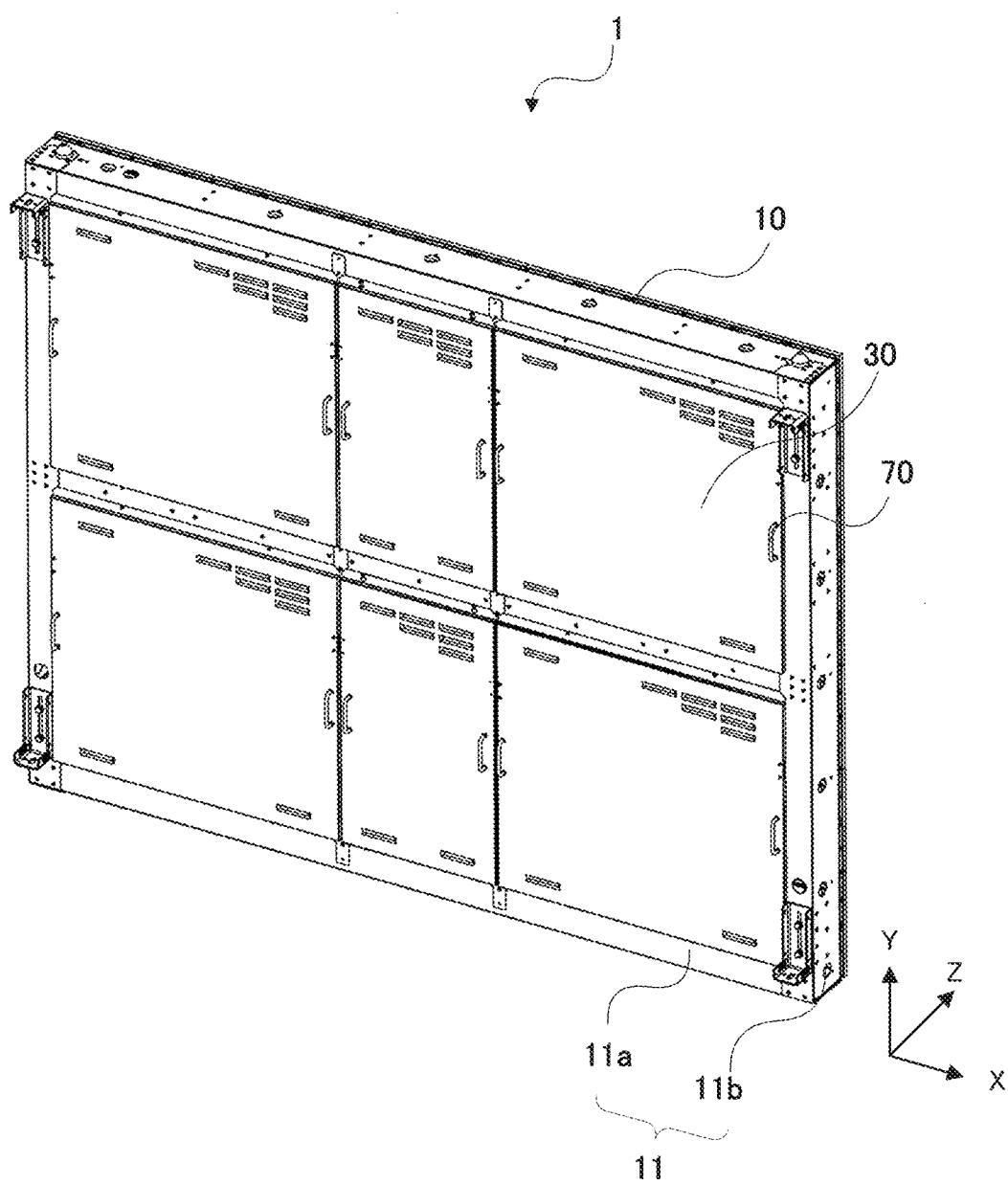
FIG. 5 is a rear view of the image display device according to the embodiment with the rear plates attached.

FIG. 1 is a front perspective view of the image display device 1 according to the present embodiment. FIG. 4 is a rear view of the image display device 1 according to the present embodiment without rear plates. FIG. 5 is a rear view of the image display device 1 according to the present embodiment with the rear plates attached. As shown in FIGS. 1, 4, and 5, the image display device 1 includes a frame 10, a plurality of display units 20 arranged in the frame 10, and rear plates 30 covering the rear surface of the frame 10 that receives the plurality of display units 20.

Each display unit 20 is configured to be rectangular and is fastened to the frame 10 with, for example, screws. Each display unit 20 is fastened to the frame 10 such that an image display surface 21 faces in the positive Z-direction. The display units 20 are laid down the frame 10 in a tiled manner, thereby forming a large image display surface as a whole.

A mask 23 (described later) is mounted on the image display surface 21 in each display unit 20. Although, in FIG. 1, there are some compartments in the frame 10 to which a display unit 20 is not attached, the display unit 20 is actually fastened to each of all compartments.

As shown in FIGS. 2A and 2B, each display unit 20 includes a substrate 22, light-emitting diodes (LEDs) 24 as display elements mounted on the substrate 22, a mask 23 covering the upper surfaces of the LEDs 24, and a case 25 accommodating the substrate 22, the LEDs 24, and the mask 23.

The substrate 22 is, for example, a rectangular flat plate having insulation properties. The LEDs 24 are mounted on the surface of the substrate 22 in the positive Z-direction to form the image display surface 21. The LEDs 24 are arranged on the substrate 22 in a matrix. More specifically, six-by-six LEDs 24 are arranged on the substrate 22. Also, an electric circuit for supplying power to the LEDs 24 is mounted, as a printed circuit, on the substrate 22.

The mask 23 is a flat plate referred to as a black matrix suppressing the reflection of external light. The mask 23 is a rectangular flat plate having the same size as the substrate 22. The mask 23 has openings 23a at positions facing the LEDs 24 to expose the LEDs 24 arranged in a matrix. Although some of the display units 20 in FIG. 1 have no mask 23 attached, each of all the display units 20 actually includes the mask 23.

The case 25 is a housing that accommodates the substrate 22, the LEDs 24, and the mask 23. The case 25 has a bottom plate 25a and an opening 25b facing the bottom plate 25a. The bottom plate 25a is a plate facing the substrate 22. The opening 25b opens in the positive Z-direction to expose the LEDs 24. The case 25 has waterproofness. For example, the case 25 is formed from a waterproof material, or has a waterproofed surface. The case 25 is, for example, formed by molding a waterproof resin.

The case 25 is described in more detail. FIG. 3A is a view of the display unit 20 in FIGS. 2A and 2B showing the surface in the negative Z-direction. FIG. 3B is a cross-sectional view taken along line A-A' in FIG. 3A. A part shown with an imaginary line p receives the substrate 22 on which the LEDs 24 are mounted. As shown in the figure, the case 25 includes a case body 26 and a shield plate 27 attached to the case body 26. The substrate 22 (not shown) is mounted on a surface of the case body 26 that faces the positive Z-direction, and the shield plate 27 is mounted on a surface of the case body 26 that faces the negative Z-direction. A surface of the shield plate 27 that faces the negative Z-direction is covered with a rear plate 30 (described later). The shield plate 27 may be directly attached to the rear surface of the substrate 22.

The surface of the case body 26 facing the negative Z-direction has a recess 26a. Signal connector terminals 26b for transmitting a signal to the LEDs 24 mounted on the substrate 22 are formed in the recess 26a.

A heatsink 28 is formed integrally with the shield plate 27 on the surface of the shield plate 27 facing the negative Z-direction. The heatsink 28 contains a power unit (not shown) for supplying power to the LEDs 24. A gap in the recess 26a is filled with silicone 26c with the shield plate 27 disposed in the recess 26a. The signal connector terminals 26b in the recess 26a are coated by the silicone 26c and are thus waterproofed by silicone potting. Partial silicone potting may be performed in which a wall is provided in order to individually isolating portions with the signal connector terminals 26b by the wall and silicone is poured into the portions.

A power connector 29 is fitted to the heatsink 28 from outside to supply power from an external power source to the power unit contained in the heatsink 28. The power connector 29 is coated with a rubber gasket on the outer periphery and thus is waterproofed.

The signal connector terminals 26b may be connected to wiring (not shown) through which a signal from an external signal source may be transmitted. The external signal is transmitted to a drive controller mounted on the substrate 22, such as a field programmable gate array (FPGA). The drive controller displays an image by controlling the LEDs 24.

As shown in FIG. 4, the frame 10 includes frame members 11, and posts 12 that partition the inside space of the frame members 11 into a matrix.

The frame members 11 include three horizontal frame members 11a extending in X-axis direction, a pair of vertical frame members 11b extending in Y-axis direction, and two strip plates 11c.

The three horizontal frame members 11a and the pair of vertical frame members 11b are combined into the rectangular frame members 11. The frame members 11 are formed from a magnetic metal, such as stainless steel. The middle and lower horizontal frame members 11a of the three horizontal frame members 11a serve as supports that support first protrusions 50 (described later) on the rear plates 30 from below. The middle and lower horizontal frame members 11a each include engagement portions to be engaged with second protrusions 60 (described later) when the rear plates are attached to the frame 10.

The strip plates 11c extend between the upper horizontal frame member 11a and the middle horizontal frame member 11a and between the middle horizontal frame member 11a and the lower horizontal frame member 11a. In the present embodiment, the two strip plates 11c both extend from the upper horizontal frame member 11a to the lower horizontal frame member 11a. The strip plates 11c are attracted by magnets 40 on the rear plates 30. The strip plates 11c are positioned in accordance with the size of the rear plates 30. To make the strip plates 11c flush with the horizontal frame members 11a, the horizontal frame members 11a have slightly recessed portions receiving the strip plates 11c.

Figure 9:
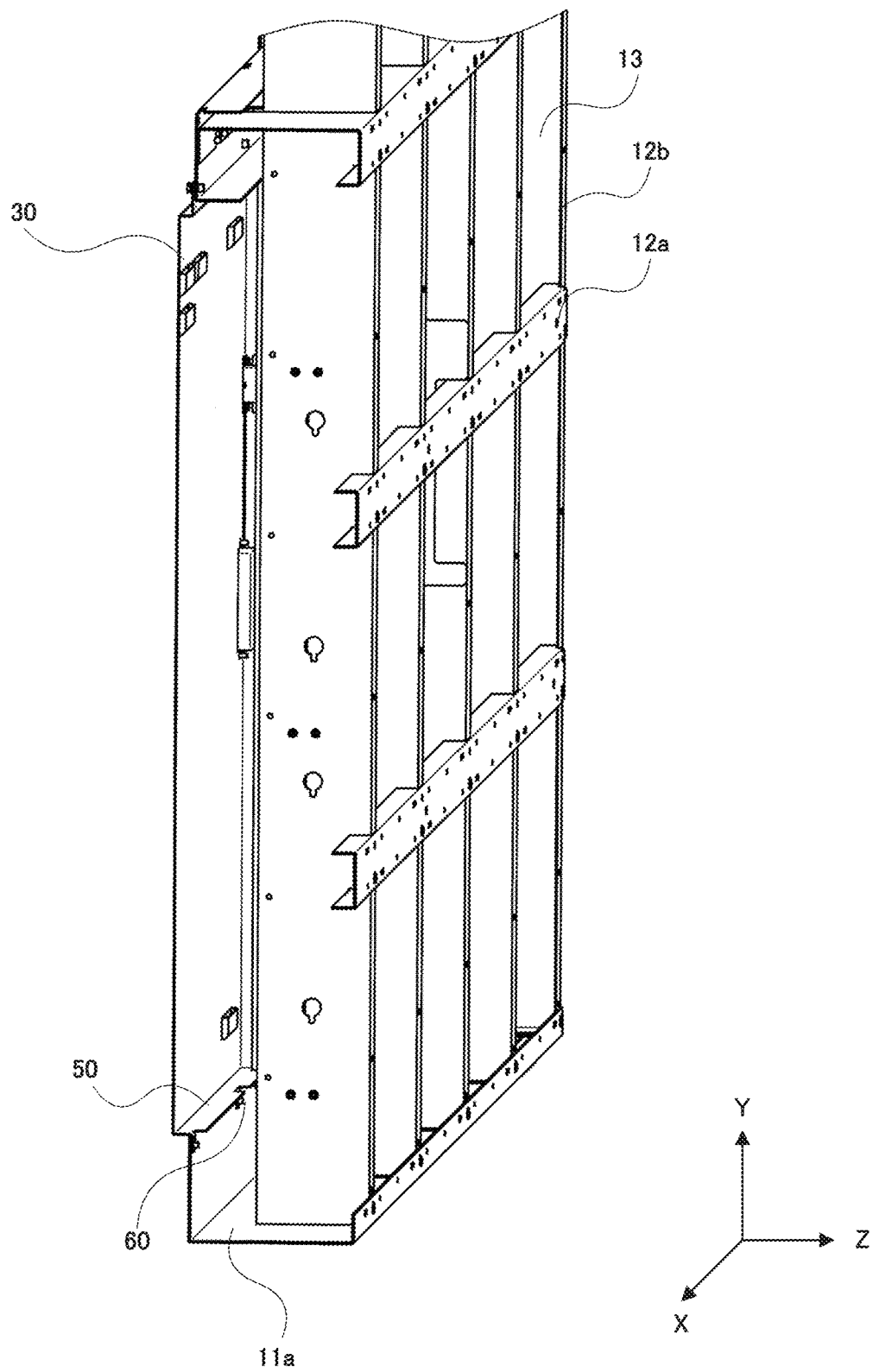
FIG. 9 is a partial cross-sectional perspective view of the image display device according to the embodiment with rear plates attached to the frame.

The posts 12 include a plurality of horizontal posts 12a extending in X-direction and a plurality of vertical posts 12b extending in Y-direction. The posts 12 are formed from metal, such as stainless steel. The horizontal posts 12a and the vertical posts 12b are arranged in a grid and fixed to each other. More specifically, as shown in FIG. 9 in an enlarged manner, the horizontal posts 12a and the vertical posts 12b have cutouts and are fixed to each other by mating the cutouts. The horizontal posts 12a and the vertical posts 12b arranged in a grid forms two or more compartments 13 arranged in a grid, or more specifically five-by-six, or thirty compartments 13. Each receive the display unit 20 is arranged in one of the thirty compartments 13.

As shown in FIG. 5, the rear plates 30 are rectangular and cover the rear surface of the frame 10. The rear plates 30 cover the two or more compartments 13 partitioned in a grid by the frame members 11. The dimensions of each rear plate 30 are determined in consideration of ease of maintenance work. More specifically, as shown in FIGS. 4 and 5, a space in which the thirty display units 20 are arranged is divided into groups each consisting of three or six compartments. The rear plates 30 are formed in accordance with the opening area of a space formed by each group of compartments. The strip plates 11c are aligned with the rear plates 30. The rear surfaces of the display units 20 in each group are covered with the corresponding rear plate 30, thereby covering the entire rear surface of the image display device 1.

Figure 6:
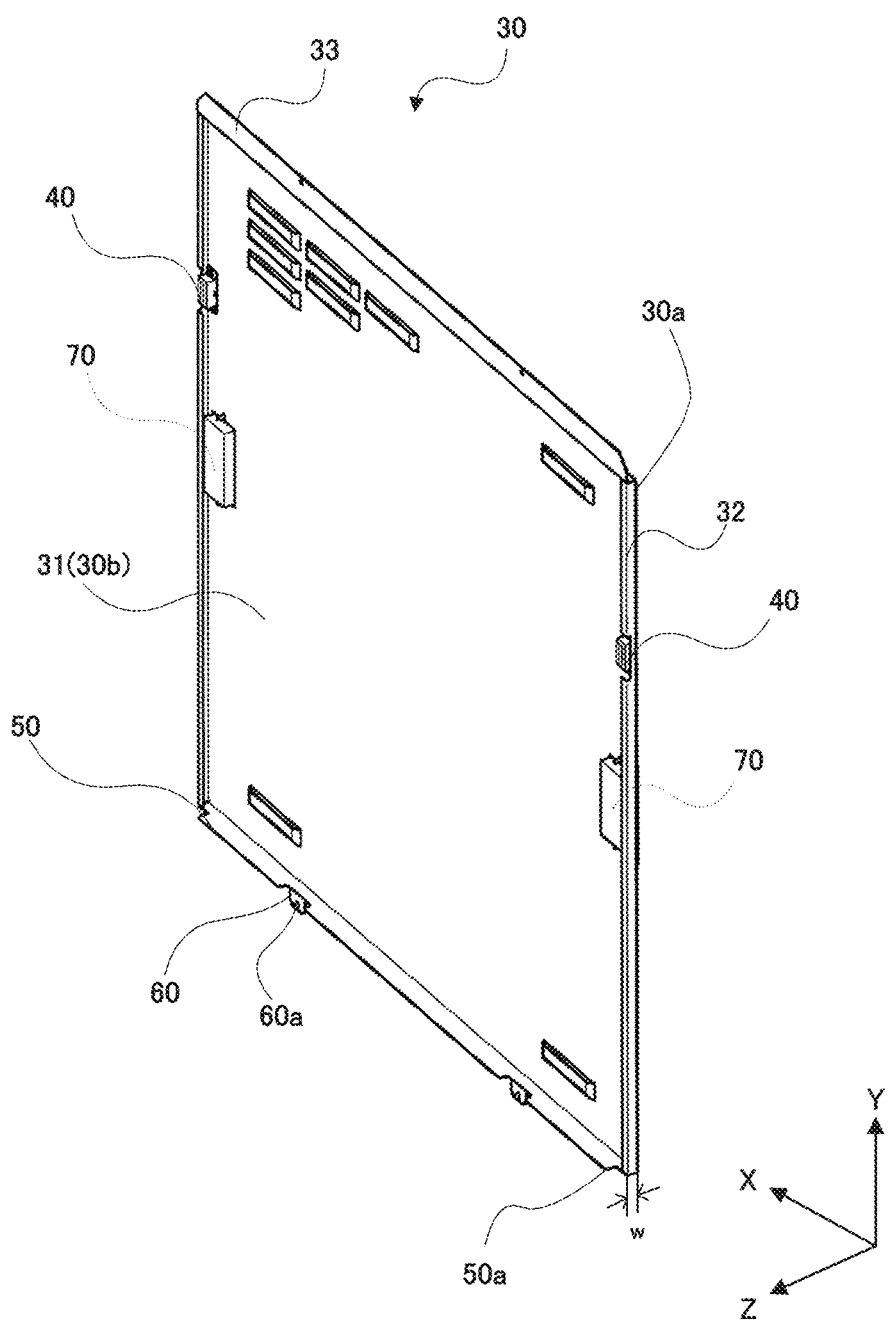
FIG. 6 is a view of a rear plate according to the embodiment as viewed from where a frame is located.

The specific structure of the rear plate 30 is shown in FIG. 6. FIG. 6 is a view showing the rear plate 30 as viewed from where the frame 10 is located.

The rear plate 30 is a plate-shaped member having a rectangular outer shape and formed from a magnetic material, such as stainless steel. The rear plate 30 prevents entrance of foreign matter and prevents deterioration of internal components due to ultraviolet rays when the image display device 1 is used outdoors.

The rear plate 30 has a rectangular middle portion 31, a rising portion 32 rising from the two lateral sides and the upper side of the middle portion 31 along the sides, the first protrusion 50 extending from the lower side of the middle portion 31 in a perpendicular direction, an extended portion 33 extending parallel to the middle portion 31 from the rising portion 32 on the upper side of the middle portion 31, and the second protrusions 60 extending perpendicularly from the first protrusion 50. The perpendicular direction herein refers to a direction perpendicular to the plate surface of the middle portion 31.

The middle portion 31 has a front surface 30a and a back surface 30b. The back surface 30b faces the frame 10. The size and shape of the middle portion 31 is determined in accordance with the size and the shape of the grouped display units 20 received in the frame 10 to which the rear plate 30 is attached. For example, the rear plate 30 is attached to an area Y that is surrounded by a solid line in FIG. 4 and that surrounds a group of six display units 20. The width of the middle portion 31 in X-direction is larger than the width of the area Y in X-axis direction. The width of the middle portion 31 in X-axis direction is determined within a range that does not cause contact between adjacent rear plates 30 in X-direction.

The rising portion 32 extends perpendicularly from the two lateral sides and the upper side of the middle portion 31. The rising portion 32 has a constant width w. The rising portion 32 is formed integrally with the middle portion 31 by bending the periphery of the flat plate.

The extended portion 33 extends from the rising portion 32 on the upper side of the middle portion 31 at a right angle. The extended portion 33 has a length that does not cause interference with an adjacent rear plate 30 in Y-axis direction. The extended portion 33 prevents entrance of external foreign matter when the rear plate 30 is attached to the frame 10.

The first protrusion 50 is a plate-shaped member extending perpendicularly from the lower side of the middle portion 31. The two ends of the first protrusion 50 in X-axis direction have cutouts 50a. The basal end of the first protrusion 50 has the same width w as the rising portion 32. The distal end defined by the cutouts 50a is formed in such a size as the distal end can be placed into the frame 10 in the area Y. The first protrusion 50 is supported by the middle horizontal frame member 11a or the lower horizontal frame member 11a when the rear plate 30 is attached to the frame 10. More specifically, the lower surface of the first protrusion 50 extending perpendicularly from the back surface 30b comes in contact with the upper surface of the horizontal frame member 11a serving as the support. The rear plate 30 is thus supported by the frame members 11.

The cutouts 50a in the first protrusion 50 come in contact with the vertical frame members 11b or the strip plate 11c arranged vertically and position the rear plate in X-axis direction and Z-axis direction when the rear plate 30 is attached to the frame 10.

The second protrusions 60 is a member extending downward and perpendicular to the first protrusion 50 from the lower surface of the first protrusion 50. The second protrusions 60 are formed by making a pair of incisions in a portion of the plate-like first protrusion 50 and bending the incised portion parallel to the middle portion 31.

Figure 11:
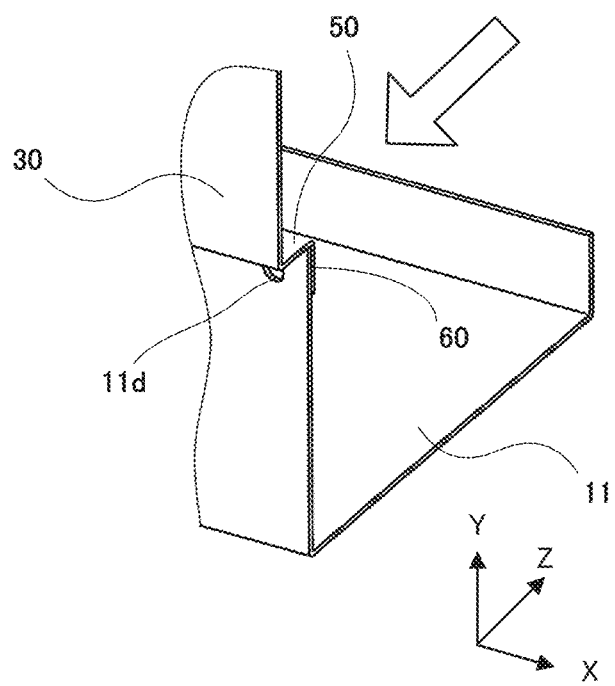
FIG. 11 is an enlarged partial schematic view of the image display device according to the embodiment describing in a state in which a force is applied to the frame and the rear plate in a negative Z-direction.

The second protrusions 60 have protuberances 60a that protrudes in the same direction as the first protrusion 50. The protuberances 60a are inserted in holes 11d formed in the frame members 11 (illustrated in FIG. 11) when the rear plate 30 is attached to the frame 10. FIG. 11 is a view showing the relationship between the first protrusion 50, the second protrusions 60, and the frame member 11. FIG. 11 is a rear view of the image display device 1 showing the main part in an enlarged manner. The second protrusions 60 are engaged with the back surface of the frame members 11. The protuberances 60a may be omitted.

The magnets 40 is attached to the back surface 30b of the middle portion 31 and handles 70 are attached to the front surface 30a as shown in FIG. 5. FIG. 5 illustrates boxes that cover ends of the handles 70 exposed on the back surface 30b with the handles 70 attached on the front surface 30a to penetrate through the middle portion 31.

Figure 7A:
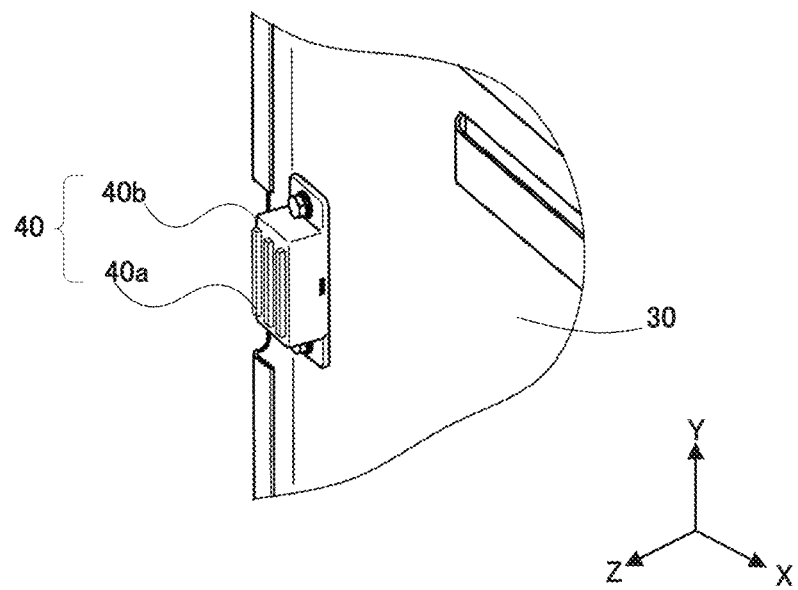
FIG. 7A is an enlarged view of a magnet attached to the rear plate according to the embodiment.
Figure 7B:
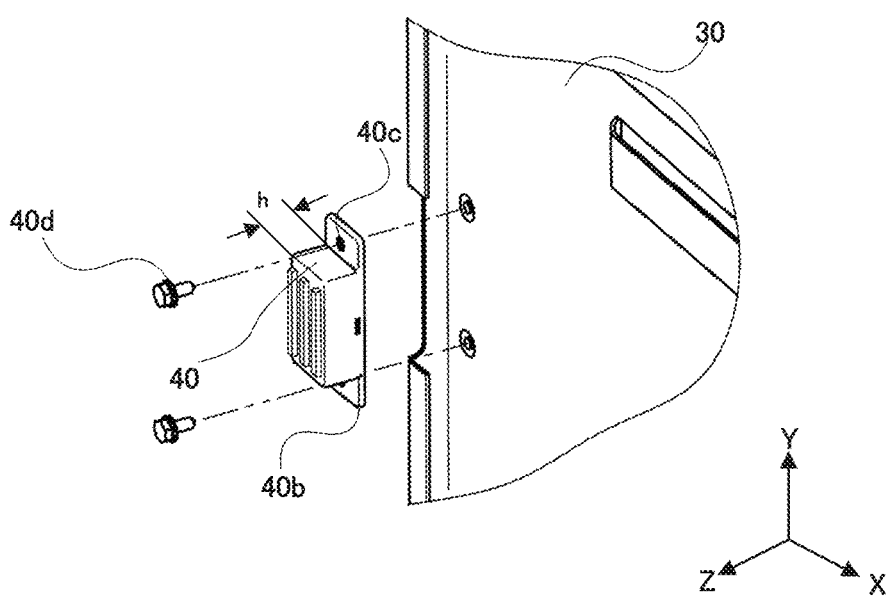
FIG. 7B is an exploded partial view of the magnet shown in FIG. 7A.

The magnets 40 are attaching/detaching members for attaching and detaching the rear plate 30 to and from the frame 10. As shown in FIG. 6, two magnets are attached on the back surface 30b of the rear plate 30 facing the frame 10 along the pair of sides facing in X-axis direction. More specifically, as shown in FIGS. 7A and 7B, each magnet 40 includes three magnet plates 40a. The magnet plates 40a are accommodated in a magnet case 40b. The magnet plates 40a are arranged parallel to one another in X-axis direction with the plate surfaces of the magnet plates facing in X-axis direction. Magnetized one end of each of the magnet plates 40a protrudes from the magnet case 40b and the other end of each of the magnet plates 40 is attached to the rear plate 30 with elastic members, such as springs. Thus, each of the magnets 40 moves in the negative Z-axis direction from an initial position when receiving a force in the negative Z-axis direction and moves in the positive Z-axis direction from the initial position when receiving a force in the positive Z-axis direction. The magnets 40 are fastened to the rear plate 30 with screws 40d through holes 40c formed in the magnet case 40b.

In FIG. 7B, each of the magnets 40 has a height h in Z-direction slightly larger than the width w of the rising portion 32 of the rear plate 30. As the rear plate 30 is placed into contact with the frame 10 from the rear surface of the image display device 1, the magnets 40 are attracted to the frame 10. The rear plate 30 is thus attached to the frame 10 to cover a portion of the rear surface of the frame 10 with the middle portion 31 spaced from the frame 10 by a distance w.

As shown in FIG. 5, two handles 70 are attached on the front surface 30a of the rear plate 30 along the pair of sides facing in X-axis direction. The handles 70 protrude from the front surface 30a of the rear plate 30. The handles 70 are U-shaped. An operator puts his or her finger in the U-shapes of the handles 70 to attach or detach the rear plate 30.

As shown in FIG. 6, the handles 70 are attached to the rear plate 30 to be placed between the facing lower side and upper side. The magnets 40 are attached between the facing upper side and the handles 70. More specifically, the handles 70 are attached to the rear plate 30 in the middle between the sides facing in Y-axis direction. The magnets 40 are attached above the handles 70.

Next, a method for attaching the rear plate 30 to the frame 10 is described with reference to FIGS. 8A to 8C.

Figure 8A:
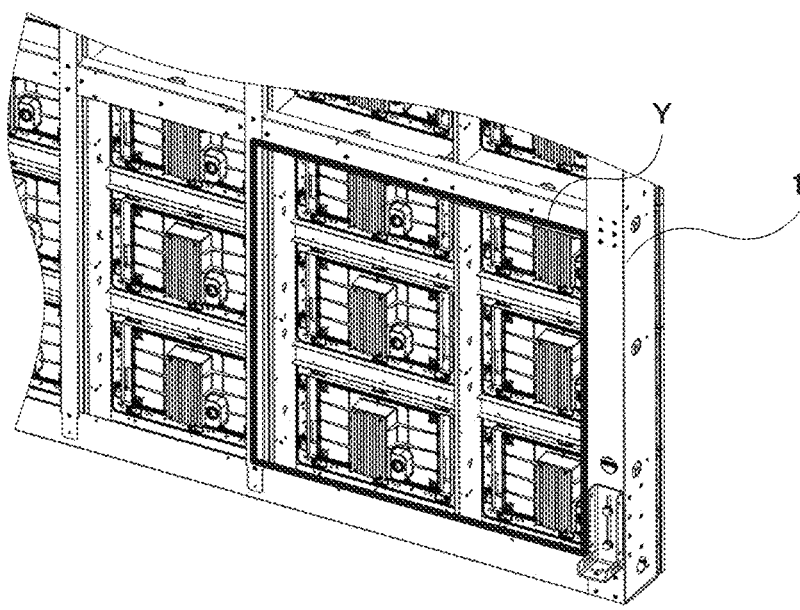
FIG. 8A is an enlarged partial view of the image display device according to the embodiment on which the rear plates have yet to be attached.

FIG. 8A is an enlarged partial view of FIG. 4. One rear plate 30 is attached in the area Y surrounded by a solid line.

Figure 8B:
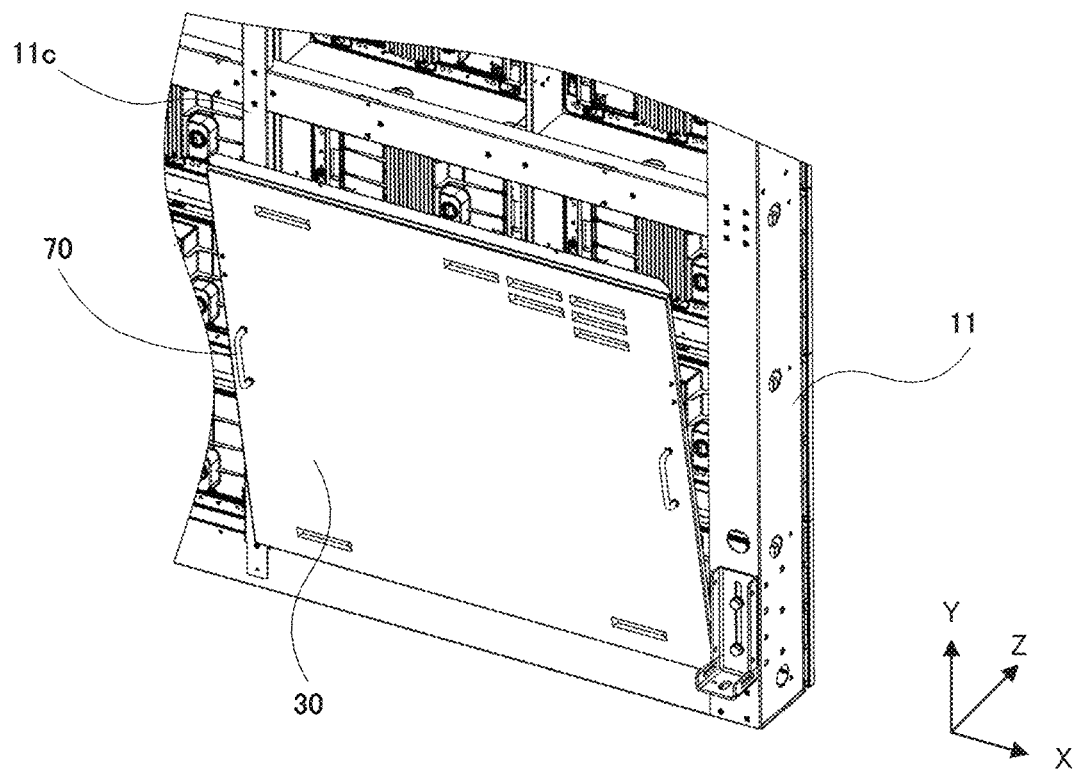
FIG. 8B is an enlarged partial view of the image display device according to the embodiment during attachment of one rear plate.

An operator first holds the handles 70 and places the rear plate 30 in the area Y of the image display device 1 with the upper side of the rear plate 30 tilted outward, as shown in FIG. 8B. The operator then inserts the distal end of the first protrusion 50 on the lower end of the rear plate 30 into a portion between the vertical frame member 11b and the strip plate 11c to place the distal end on the horizontal frame member 11a. As a result, positions of the rear plate 30 in X-axis direction and Y-axis direction are determined. In this state, the two ends of the basal end of the first protrusion 50 are made to come into contact with the vertical frame member 11b and the strip plate 11c. As a result a position of the lower end of the rear plate 30 in Z-axis direction is determined.

Figure 8C:
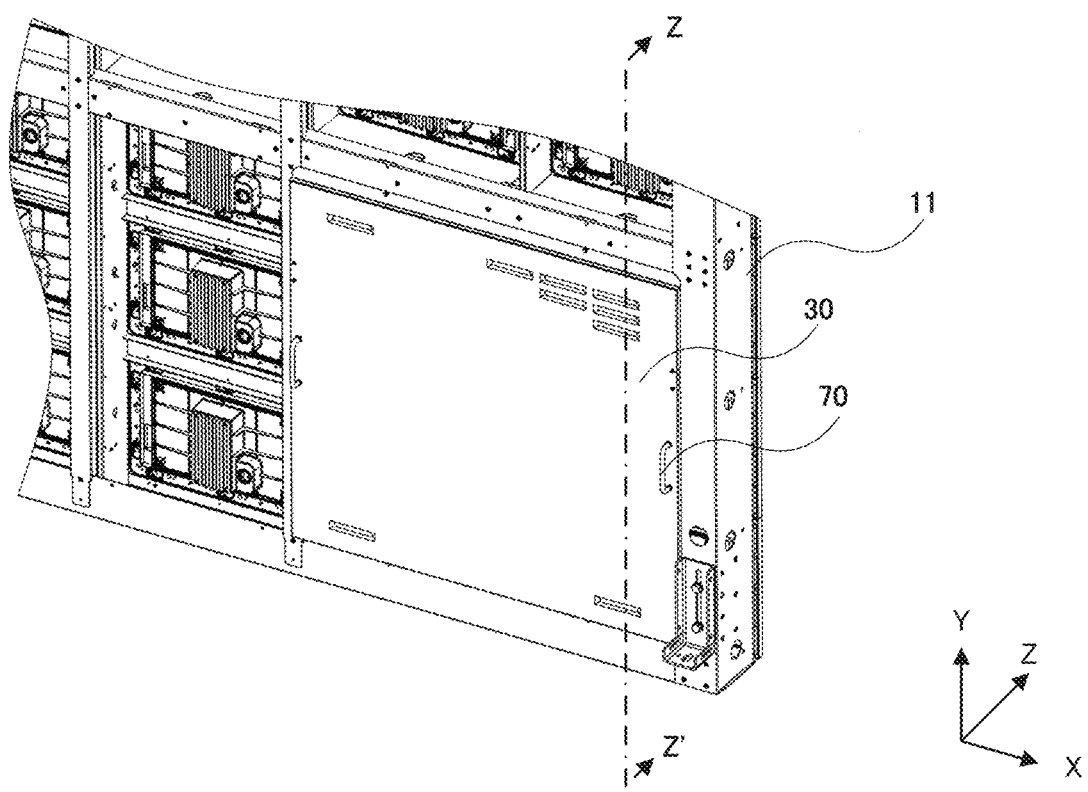
FIG. 8C is an enlarged partial view of the image display device according to the embodiment on which one rear plate has been attached.

Subsequently, the operator pushes the upper portion of the rear plate 30 toward the frame 10 as shown in FIG. 8C to make the extended portion 33 come into contact with the frame 10. The magnets 40 attract the frame members 11 formed from a magnetic material. The protuberances 60a of the second protrusions 60 are inserted in the holes 11d in the frame members 11. The rear plate 30 is attached to the frame 10 in this manner.

FIG. 9 is a cross-sectional perspective view taken along line Z-Z' in FIG. 8C as viewed from the frame 10. In FIG. 9, the display unit 20 is not shown. As shown in the figure, upon attaching the rear plate 30 to the frame 10, the lower surface of the first protrusion 50 comes into contact with the horizontal frame member 11a. Thus, even if the image display device 1 receives a force in the direction of gravity, that is, a force in the negative Y-direction, the first protrusion 50 coming into contact with the frame members 11 prevents the rear plate 30 from falling off the frame 10.

Figure 10A:
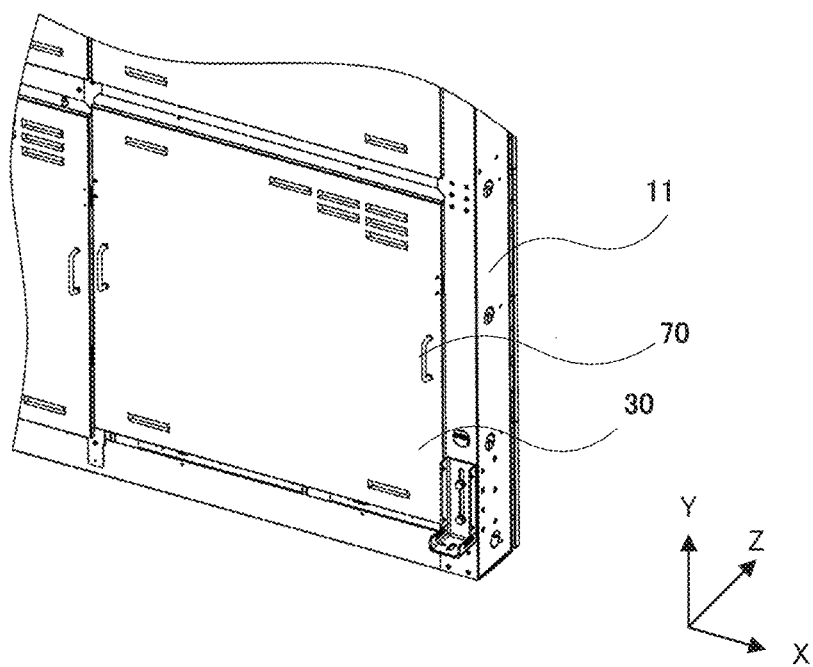
FIG. 10A is an enlarged partial view of the image display device according to the embodiment during detachment of one rear plate.

Next, a method for detaching from the frame 10 the rear plate 30 attached to the frame 10 is described with reference to FIGS. 10A and 10B.

An operator first holds the handles 70 and pushes the lower end of the rear plate 30 toward the frame 10. The magnet plates 40a are thus pushed inward by the frame member 11 and the post 12, thereby disengaging the protuberances 60a of the second protrusions 60 from the holes 11d. In this state, as shown in FIG. 10A, the operator lifts the rear plate 30 in Y-axis direction by the length of the second protrusions 60, thereby separating the first protrusion 50 and the second protrusions 60 from the frame members 11.

Figure 10B:
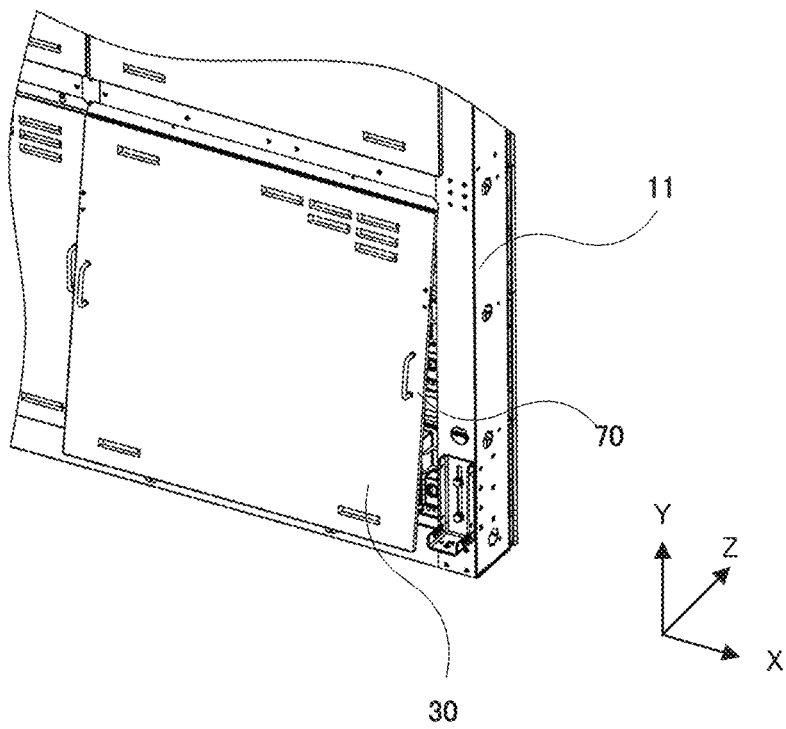
FIG. 10B is an enlarged partial view of the image display device according to the embodiment during detachment of one rear plate.

As shown in FIG. 10B, the operator then slants the lower portion of the rear plate 30 toward the operator. As a result, the pulling force overcomes and the rear plate is released from the attraction by the magnets 40, thereby separating the rear plate 30 from the frame 10. The handles 70 are attached below the magnets 40, so that the operator can thus easily detach the rear plate 30 due to the principle of leverage.

If the lower portion of the rear plate 30 is first pulled toward the operator to detach the rear plate 30 from the frame 10, the horizontal frame member 11a interferes with the second protrusions 60 and thus prevents the rear plate 30 from being detached from the frame 10. The second protrusions 60 prevent the rear plate 30 from separating from the frame 10 when the image display device 1 receives a force in the negative Z-axis direction.

In the present embodiment, the magnets 40 on the back surface 30b of the rear plate 30 attract to the frame 10 to fix the rear plate 30 to the frame 10. The rear plate 30 can be detached from the frame 10 by separating the magnets 40 from the frame 10. Thus, the rear plate 30 can be attached and detached to and from the frame 10 easily without using a special tool, thus easing maintenance work.

The first protrusion 50 on the rear plate 30 is placed on the support of the frame members 11, thereby making it possible to prevent the rear plate 30 from falling off the frame 10 when the image display device 1 receives a force in the direction of gravity.

The rear plate 30 has the second protrusions 60, and the second protrusions 60 face the inner surface of the frame member 11 or the post 12 that is parallel to the lower side of rear plate 30, thereby making it possible to prevent the rear plate 30 from falling off the frame 10 even if the rear plate 30 receives a force in the negative Z-direction.

The case 25 has a waterproofed surface facing the rear plate 30. Thus, even if water enters through a gap between the rear plate 30 and the frame 10, the water does not cause any trouble with the electric circuit or the LEDs 24.

Modified Example 1

In the above embodiment, the handles 70 are U-shaped. However, the handles may have any shape and size that allow the operator to operate the rear plate 30. For example, the handles may have recesses that are hollow toward the frame 10 from the surface of the rear plate 30.

Figure 12:
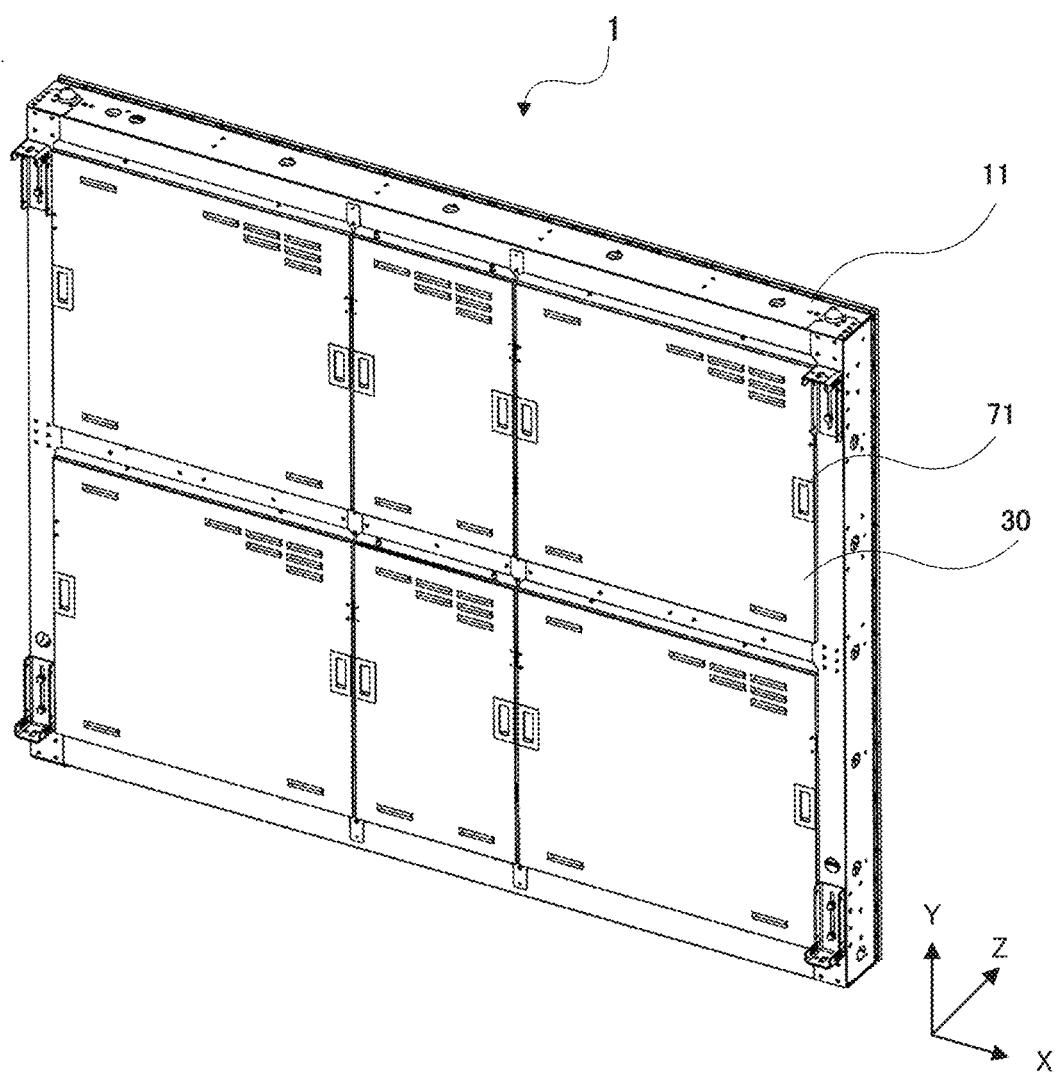
FIG. 12 is a rear view of an image display device with rear plates according to Modified example 1.

FIG. 12 is a rear view of the image display device 1 to which rear plates 30 each including recessed handles 71 are attached. Except the handles 71, the structure is the same as in the above embodiment.

Figure 13:
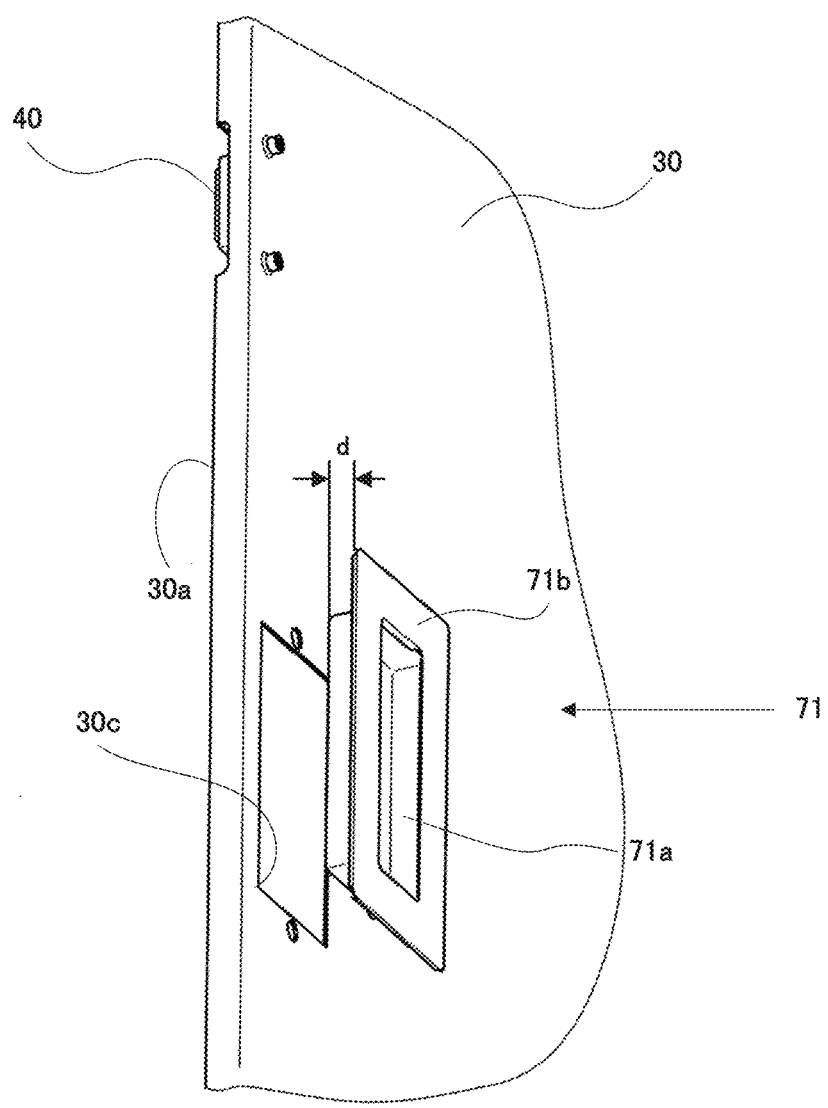
FIG. 13 is an enlarged view of a main part of the rear plate according to Modified example 1.

FIG. 13 is a partially enlarged development view of the rear plate 30 to which the handle 71 is attached. The handle 71 has a recess, a substantially rectangular portion 71a and a mounting portion 71b extending outward from the periphery of the rectangular portion 71a. The rear plate 30 has an insertion hole 30c receiving the rectangular portion 71a. The protrusion on the rectangular portion 71a in the handle 71 is inserted in the insertion hole 30c. The mounting portion 71b is then fastened to the rear plate 30 with screws, thereby fixing the handle 71 to the rear plate 30. The rectangular portion 71a has a depth d equal to or smaller than the width w of the rising portion 32 of the rear plate 30.

The structure according to the present modification also allows maintenance work by holding of the handles 71.

Figure 14:
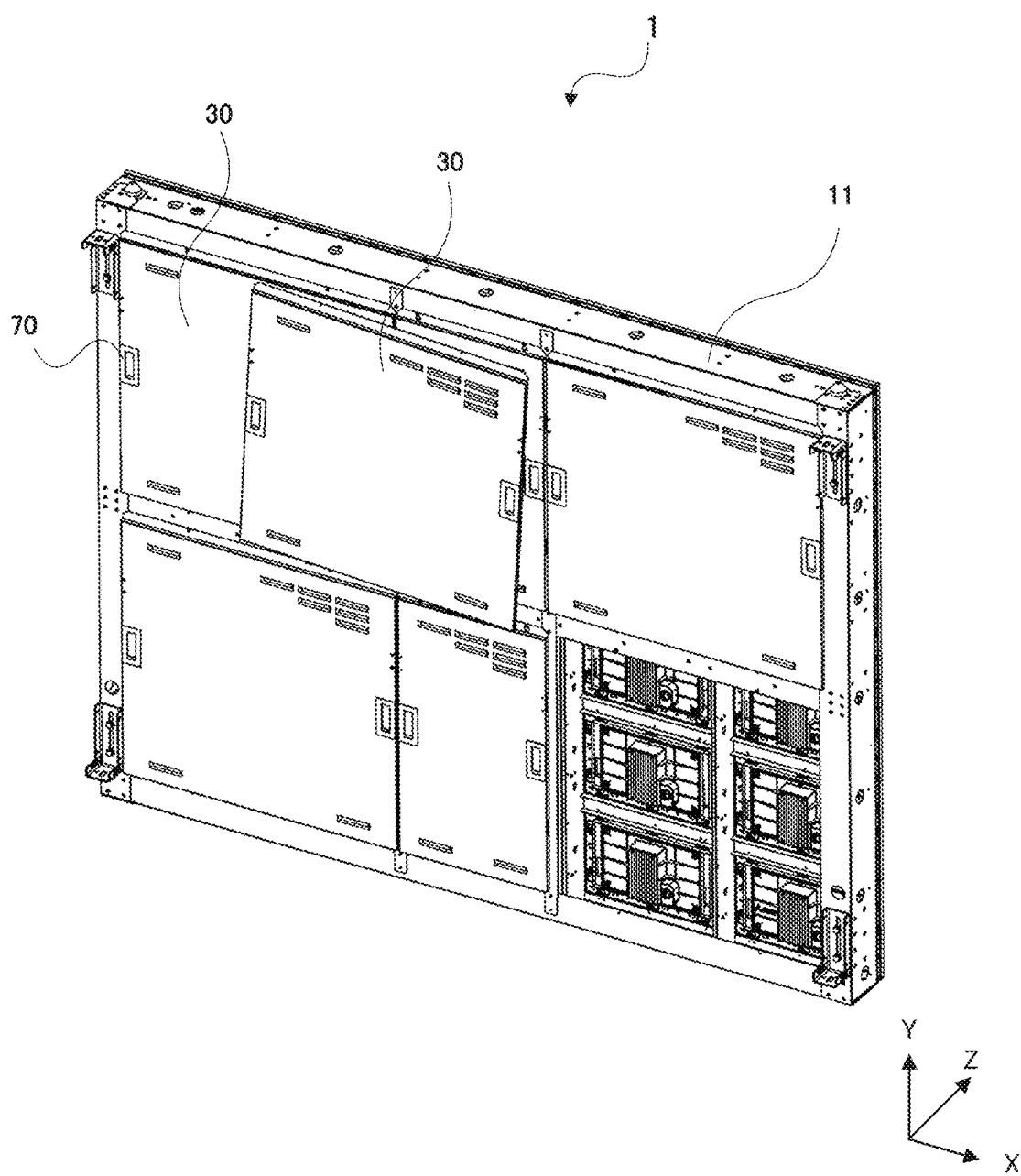
FIG. 14 is a rear view of the image display device showing an example of the use of the rear plates according to Modified example 1.

The depths d of the recesses of the recessed handles 71 are equal to or smaller than the width w of the rear plate 30, so that major unevenness on the rear plate does not occur. Thus, multiple rear plates 30 can be stacked on one another. As shown in FIG. 14, the rear plate 30 may be stuck on other rear plates 30 with the magnets 40. The strength of the magnets 40 may be determined to allow the rear plates 30 having the U-shaped handles 70 to be stacked on one another during maintenance work.

Modified Example 2

In the above embodiment, the magnets 40 are located on the rear plate 30, and the frame members 11 are formed from a magnetic material. The present disclosure is not limited to such a structure. For example, the frame members 11 may be shaped using a lightweight aluminum or resin material, and a magnetic member may be attached to portions facing the magnets 40. Also, the portions to face the magnets 40 may be formed from a magnetic material. Additionally, magnets magnetized as poles opposite to the magnets 40 may be attached to the frame members 11.

In the above embodiment, the magnets 40 are attached to the rear plate 30. However, the magnets 40 may be attached to any position that allows easy attachment and detachment of the rear plate 30. For example, magnets may be attached to the frame members 11, and the rear plate 30 may be partially or entirely formed from a magnetic material. In this case, the magnets 40 are attached to the frame members 11 with elastic members. Also, magnets generating an attracting force to the magnets 40 may be arranged at portions corresponding to the magnets 40 of the frame members 11.

Modification 3

In the above examples, the attaching/detaching member includes the magnets 40. However, the attaching/detaching member may be any member that allows attachment and detachment of the rear plate 30 to and from the frame 10 without using any tools. For example, fasteners using an urging force or an elastic force may be used as shown in FIGS. 15A to 15C.

Figure 15A:
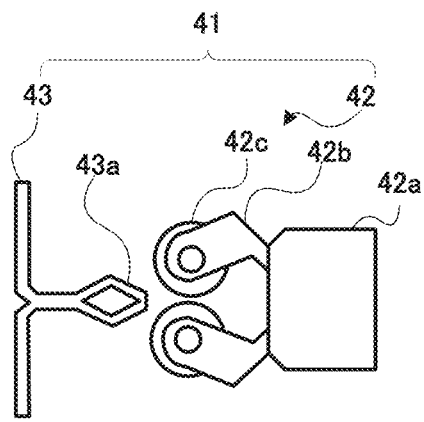
FIG. 15A is a view of a main part of a fastener according to Modified example 2.
Figure 15B:
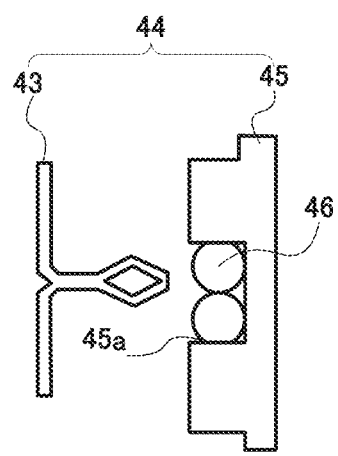
FIG. 15B is a view of a main part of a fastener according to Modified example 2.

FIGS. 15A and 15B show examples of fasteners using an urging force. In the examples shown in FIGS. 15A and 15B, roller catches are used. As shown in FIG. 15A, a roller catch 41 includes a catch body 42 and a strike 43. The catch body 42 includes a base 42a, a pair of arms 42b mounted on the base 42a, and a pair of rollers 42c attached to the distal ends of the arms 42b. The pair of arms 42b are closed by urging members, such as springs, embedded in the base 42a. The strike 43 has a distal end 43a protruding in a certain direction. As the distal end 43a of the strike 43 is inserted between the rollers 42c, the arms 42b are open and closed to allow the catch body 42 to hold the strike 43.

FIG. 15B shows a roller catch 44 that differs from the roller catch 41 shown in FIG. 15A in the structure of the catch body. The roller catch 44 includes a catch body 45. The catch body 45 has a recess 45a and a pair of rollers 46 is inserted into the recess 45a. The rollers 46 are urged to become close to each other by urging members, such as springs, embedded in the side walls of the recess 45a. As the strike 43 enters between the rollers 46, the rollers 46 move away from each other to receive the strike 43. The strike 43 received between the rollers 46 is held by the catch body 45.

Figure 15C:
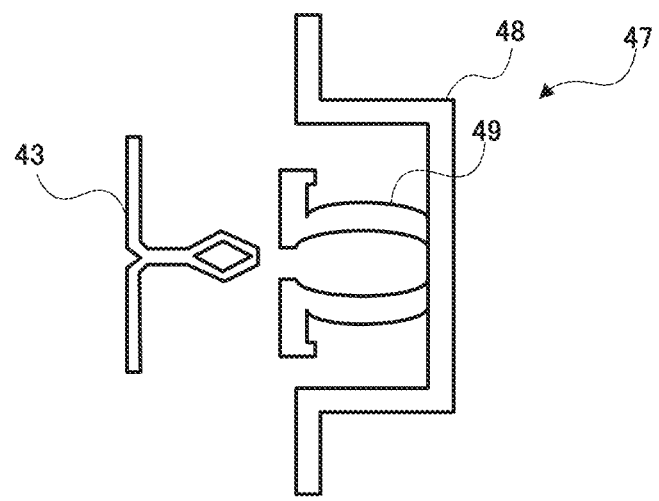
FIG. 15C is a view of a main part of a fastener according to Modified example 2.

FIG. 15C shows an example of a fastener that uses an elastic force to allow attachment and detachment of the rear plate 30. In the example shown in FIG. 15C, a strike 43 and a clip 47 are used. As shown in FIG. 15C, the clip 47 includes a clip body 48 and a receiver 49 that receives the strike 43 within the clip body 48. The clip 47 is formed from an elastic resin material. As the strike 43 enters the receiver 49, the receiver 49 elastically deforms and receives the strike 43. The strike 43 received in the receiver 49 is held by the clip body 48.

The fasteners shown in FIGS. 15A to 15C are each used to attach the strike 43 to the rear plate 30 and the catch body 42 or 45, or the clip 47 to the frame member 11 or the post 12. The fasteners may be used to attach the strike 43 to the frame members 11 or the post 12 and the catch body 42 or 45, or the clip 47 to the rear plate 30.

The fasteners shown in FIGS. 15A to 15C are attached to the rear plate 30 and the frame member 11 or the post 12, thereby allowing attachment of the rear plate 30 to the frame 10.

According to the present modification, the fastener that uses an urging force or an elastic force is used, so that there is no need to form the frame members 11 from a magnetic material. For example, the frame members 11 may be shaped using aluminum or a resin, thereby easing formation of the frame member and making it possible to reduce the weight of the image display device 1.

Although the embodiments of the present disclosure have been described above, the present disclosure is not limited to the above embodiments and modifications.

In the above embodiment, the LEDs are used as a display element. The display element may be other than LEDs. The display unit 20 may be, for example, an organic electroluminescence (EL) display or a liquid crystal panel.

In the above embodiment, the rear plate 30 includes the first protrusion 50 and the second protrusions 60. The rear plate 30 may include the first protrusion 50 alone. In the case of the rear plate 30 including the first protrusion 50 alone, the rear plate 30 is attached to the frame 10 by inserting the first protrusion 50 into the frame 10 along one side of the frame member 11 or the post 12 and causing the magnets 40 to be attracted to the frame members 11.

In the above embodiment, the case 25 is shaped using a resin material. However, the present disclosure is not limited to the case 25 shaped using a resin material. More specifically, the case 25 may be shaped using a metal material, and then a rear surface of the case 25 may be waterproofed. For example, the rear surface of the case may be coated with a resin film to be waterproofed.

In the above embodiment, the first protrusion 50 is formed by bending an end of the rear plate 30. However, a plate separate from the rear plate 30 may be joined to the rear plate 30 by, for example, welding. Also, in the above embodiment, the first protrusion 50 is formed along the bottom side of the rear plate 30. However, the first protrusion 50 may be protrusions that are attached to the rear plate 30 at regular intervals along the bottom side of the rear plate 30.

In the above embodiment, the second protrusions 60 are shaped integrally with the first protrusion 50 by making a pair of incisions in a portion of the plate-like first protrusion 50 and bending the incised portion parallel to the rear plate 30. The second protrusions 60 may not be shaped integrally with the first protrusion 50, and a member different from the first protrusion 50 may be attached to the first protrusion 50.

In the above embodiment, the magnet 40 is described as an example of the attaching/detaching member. The attaching/detaching member according to the disclosure is not limited to the magnet 40 or the roller catch 41 or 44, and may be any member that allows easy attachment and detachment to and from the frame member 11 or the post 12. For example, the attaching/detaching member may be an adhesive tape attached to the back surface 30b of the rear plate 30. The attaching/detaching member may be a member having a latch structure.

In the above embodiment, two handles 70 or 71 are used. However, one or at least three handles may be used. Also, in the above embodiment, the handles 70 or 71 are attached on the rear plate 30 along the pair of sides facing in X-axis direction. However, the handles may be attached to any portion on the rear plate 30.

In the above embodiment and Modifications 1 to 3, the rear plate 30 includes the first protrusion 50 and the second protrusions 60. However, the first protrusion 50 and the second protrusions 60 may be omitted.

In the above embodiment and Modifications 1 to 3, the rear plate 30 is fully detachable from the frame 10. However, the present disclosure is not limited to such a rear plate 30. The rear plate may be a door-like rear plate that has one side fixed to the frame in a pivotable manner and to which an attaching/detaching member is attached. In this case, there is no need for the rear plate to include the first protrusion 50 and the second protrusions 60. Additionally, a handle may be attached to the side of the rear plate facing the side fixed to the frame so that the handle may be held to open and close the rear plate.

In the above embodiment and Modifications 1 to 3, the rear plate 30 covers at least one of two or more compartments partitioned in a grid by the posts 12. However, in a case of a small image display device, the rear plate able to cover all the two or more compartments may be used to cover the entire rear surface of the image display device.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is preferably available for an image display device for displaying an image.

REFERENCE SIGNS LIST

1 Image display device
10 Frame
11 Frame member
11a Horizontal frame member
11b Vertical frame member
11c Strip plate
11d Hole
12 Post
12a Horizontal post
12b Vertical post
13 Compartment
20 Display unit
21 Image display surface
22 Substrate
23 Mask
23a Opening
24 LED
25 Case
25a Bottom plate
25b Opening
26 Case body
26a Recess
26b Signal connector terminal
26c Silicone
27 Shield plate
28 Heat sink
29 Power connector
30 Rear plate
30a Front surface
30b Back surface
30c Insertion hole
31 Middle portion
32 Rising portion
33 Extended portion
40 Magnet
40a Magnet plate
40b Magnet case
40c Hole
40d Screw
41, 44 Roller catch
42, 45 Catch body
42a Base
42b Arm
42c Roller
43 Strike
43a Distal end
45a Recess
46 Roller
47 Clip
48 Clip body
49 Receiver
50 First protrusion
50a Cutout
22
60 Second protrusion
60a Recess
70, 71 Handle
71a Rectangular portion
71b Mounting portion

The invention claimed is:

1. An image display device, comprising:
a frame comprising a rectangular frame member and posts partitioning an inside space defined by the rectangular frame member into a matrix of spaces;
display units to display an image, the display units being arranged in the corresponding spaces;
a rear plate covering a rear surface of at least one display unit of the display units; and
an attaching/detaching member attaching the rear plate to the frame in a detachable manner, wherein
the rear plate comprises a first protrusion protruding from a lower side of the rear plate in a direction perpendicular to the rear plate,
the frame comprises a support extending in a horizontal direction, and
the rear plate is attached to the frame in a detachable manner with the attaching/detaching member with the first protrusion supported by the support of the frame, and
the rear plate comprises a second protrusion protruding perpendicularly from the first protrusion, the frame comprises an engagement portion engaged with the second protrusion, and the rear plate is attached to the frame in a detachable manner with the attaching/detaching member with (i) the first protrusion supported by the support of the frame and (ii) the second protrusion engaged with the engagement portion.

2. The image display device according to claim 1, wherein the inside space surrounded by the rectangular frame member is partitioned into sections when viewed from a rear surface-side, and the rear plate is attached to cover the rear surface of the at least one display unit, the rear plate covering each of the sections.

3. The image display device according to claim 1, wherein the attaching/detaching member comprises a first magnet disposed on one of the frame and the rear plate, and a magnetic material or a second magnet disposed on another of the frame and the rear plate.

4. The image display device according to claim 3, wherein the first and second magnets are fixed to the frame or the rear plate with an elastic member.

5. The image display device according to claim 1, wherein the attaching/detaching member comprises a catch disposed on one of the frame and the rear plate, and a strike disposed on another of the frame and the rear plate.

6. The image display device according to claim 1, wherein the rear plate comprises a handle, and the attaching/detaching member is disposed between a position of the handle and an upper side of the rear plate.

7. An image display device comprising: a frame comprising a support extending in a horizontal direction and an engagement portion; a display unit to display an image, the display unit being arranged in the frame; a rear plate covering a rear surface of the display unit, the rear plate comprising a first protrusion protruding from a lower side of the rear plate in a perpendicular direction and a second protrusion protruding perpendicularly from the first protrusion; and an attaching/detaching member attaching the rear plate to the frame in a detachable manner, wherein the rear plate is attached to the frame in a detachable manner with the attaching/detaching member with (i) the first protrusion supported by the support of the frame and (ii) the second protrusion engaged with the engagement portion of the frame, the attaching/detaching member comprises a first magnet disposed on one of the frame and the rear plate, and a magnetic material or a second magnet disposed on another of the frame and the rear plate, the first and second magnets are fixed to the frame or the rear plate with an elastic member, and the elastic member is configured to stretch in a direction in which the first protrusion protrudes, and the elastic member is pressed toward the frame, thereby disengaging the second protrusion from the engagement portion.

8. The image display device according to claim 7, wherein the rear plate comprises a handle, and the attaching/detaching member is disposed between a position of the handle and an upper side of the rear plate.

* * * * *